United States Patent [19]

Lint

[11] Patent Number: 5,309,130
[45] Date of Patent: May 3, 1994

[54] SELF LEADED SURFACE MOUNT COIL LEAD FORM

[75] Inventor: James D. Lint, San Diego, Calif.

[73] Assignee: Pulse Engineering, Inc., San Diego, Calif.

[21] Appl. No.: 968,035

[22] Filed: Oct. 26, 1992

[51] Int. Cl.⁵ .............................. H01F 15/02
[52] U.S. Cl. ......................... 336/65; 336/92; 336/192; 336/229
[58] Field of Search ................. 336/65, 92, 192, 208, 336/229

[56] References Cited

U.S. PATENT DOCUMENTS

| | | | |
|---|---|---|---|
| 3,848,208 | 11/1974 | Dawson et al. | 336/208 X |
| 4,149,135 | 4/1979 | Roespel et al. | 336/65 |
| 4,347,493 | 8/1982 | Adams et al. | 336/208 X |
| 4,363,014 | 12/1982 | Leach et al. | 336/208 X |
| 4,548,385 | 10/1985 | Marzec et al. | 242/4 R |
| 4,656,450 | 4/1987 | Jarosz et al. | 336/208 X |
| 4,888,571 | 12/1989 | Kobayashi et al. | 336/65 |
| 5,015,981 | 5/1991 | Lint et al. | 336/65 |
| 5,032,953 | 7/1991 | Carl et al. | 361/394 |
| 5,235,305 | 8/1993 | Scheffler | 336/208 X |

*Primary Examiner*—Leo P. Picard
*Assistant Examiner*—L. Thomas
*Attorney, Agent, or Firm*—Baker, Maxham, Jester & Meador

[57] ABSTRACT

A self leaded holder for surface mounting of a circuit element to a PC board comprises a generally box-like support body having a cavity for mounting a circuit element, the support body having a base and a plurality of lead support members having a generally spool configuration extending generally horizontally outward from the support body adjacent the base, lead ports extending from the cavity through the sides, an inductance coil mounted in the cavity, and a lead extending from the coil via the lead ports to and wound a partial turn around each of the lead support members and disposed for surface bonding to a PC board.

20 Claims, 2 Drawing Sheets

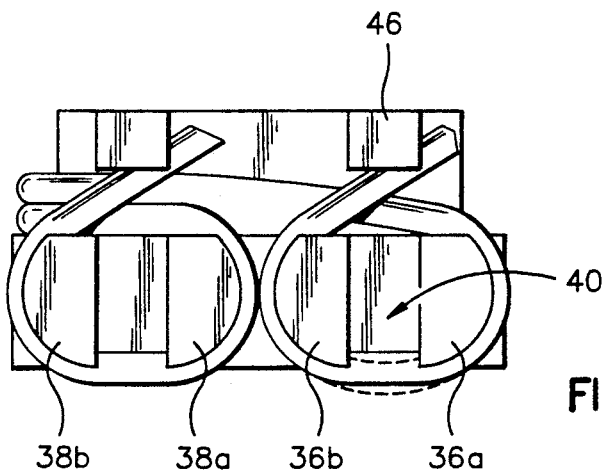
FIG. 4
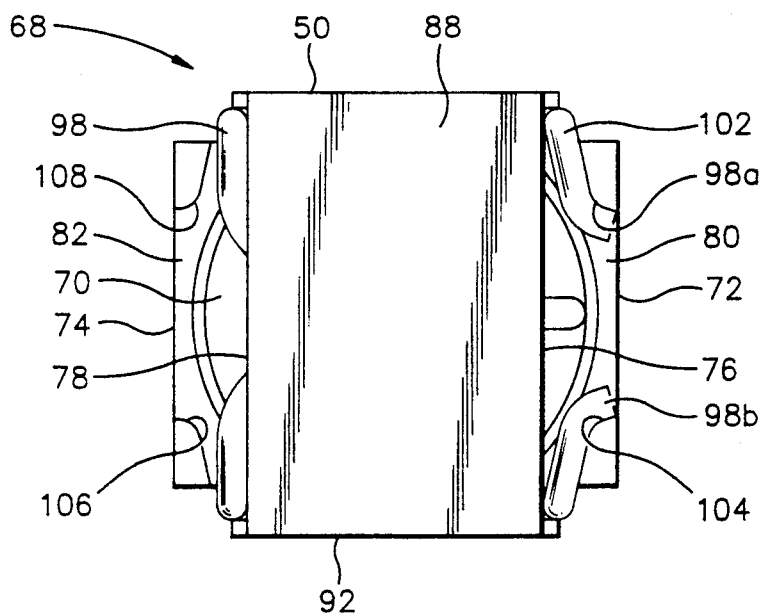
FIG. 5
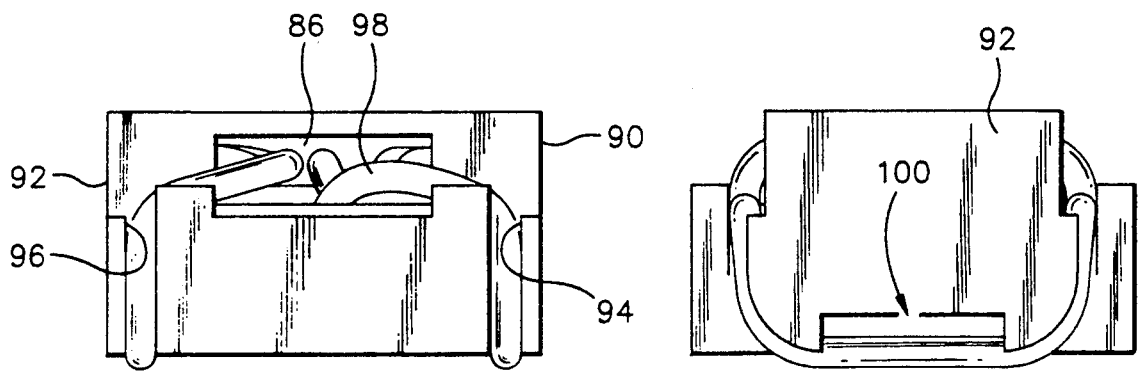
FIG. 6
FIG. 7

SELF LEADED SURFACE MOUNT COIL LEAD FORM

BACKGROUND OF THE INVENTION

The present invention relates to electronic component packaging, and pertains particularly to an improved package having self leaded coil lead form for improved surface mounting.

For many years, electronic circuit boards have been fabricated by interconnecting a plurality of electronic components, both active and passive, on a planar printed circuit board. Typically, this printed circuit board has comprised an Epoxy/fiberglass laminate substrate clad with a sheet of copper, which has been etched to delineate the conductive paths. Holes were drilled through terminal portions of the conductive paths for receiving electronic component leads, which were subsequently soldered thereto.

More recently, so-called surface mount technology has evolved to permit more efficient automatic mass production of circuit boards with higher component densities. With this approach, certain packaged components are automatically placed at preselected locations on top of a printed circuit board, so that their leads are registered with, and lie on top of corresponding solder paths or pads. The printed circuit board is then processed by exposure to infrared or vapor phase soldering techniques to re-flow the solder, and thereby establish a permanent electrical connection between the leads and their corresponding conductive paths on the printed circuit board.

The increasing miniaturization of electrical and electronic elements and high density mounting thereof has created increasing problems with electrical isolation and mechanical interconnection. In particular, it creates more difficulty establishing reliable and efficient connection between packaged components and egress hardware or terminals. Presently known interconnect methods severely limit the ability to provide density and reliable electrical and mechanical isolation between distinct egress or terminal points due to space limitations.

Among the electrical and electronic elements that must be surface mounted on PC boards are coils, such as bi-filar wound cores used as inductors or other components in circuits. These are preferably connected through some form of header or packaging with suitable terminals. The current technique of surface mounting of these and other similar components is by separate component lead terminals. Recent improvements have been made, such as disclosed in U.S. Pat. No. 5,015,981, issued May 14, 1991 to Lint et al, and U.S. Pat. No. 5,032,953, issued July 16, 1991 to Carl et al, both assigned to the assignee hereof. These current techniques of mounting are time consuming, difficult to machine assemble, and frequently result in reliability problems.

Other recent improvements are disclosed in co-pending application Ser. No. 07/825,148, filed Jan. 24, 1992, of common assignment herewith. Those improvements include means which provide for the end of the coil wires or leads to serve as the lead terminal. The structures disclosed therein are suitable for fine gauge wire, but are not suitable for heavier gauge wire.

It is, therefore, desirable that an improved package with improved lead form for termination and mounting of electronic components be available.

SUMMARY AND OBJECTS OF THE INVENTION

It is the primary object of the present invention to provide an improved package with improved lead form and method of mounting of electrical components.

In accordance with a primary aspect of the present invention, an electronic circuit package for a device having a plurality of leads comprises a three dimensional holder of a non-conducting material having a cavity therein for holding a circuit element, a plurality of routing passages for accommodating leads extending from the element through the passages and guides to the base, and a plurality of lead terminal mounts on the base of the holder, and each lead having an end portion wound on one of said lead terminal mounts and function as a lead terminal.

BRIEF DESCRIPTION OF THE DRAWING

The above and other objects and advantages of the present invention will become apparent from the following description when read in conjunction with the accompanying drawings wherein:

FIG. 4 is an end elevation view of the embodiment of FIG. 1;

FIG. 5 is a view like FIG. 1 of an alternate embodiment of the invention;

FIG. 6 is a side elevation view of the embodiment of FIG. 5; and

FIG. 7 is an end elevation view of the embodiment of FIG. 5.

DETAILED DESCRIPTION OF A PREFERRED EMBODIMENT

Turning to the drawings, and particularly to FIGS. 1-4, there is illustrated an exemplary preferred embodiment of the present invention, designated generally by the numeral 10. The invention comprises a holder or carrier for electronic or electrical elements with means passage, guidance and forming of lead ends into terminals for surface mounting. It provides a self leaded surface mounted coplanar holder or header for simple and easy surface mounting of an electronic component on PC boards. A header is the part of a sealed component or assembly that provides support and insulation for leads passing through the walls. The term lead means a conductive wire to or from a circuit element. Terminal means a point of connection for two or more conductors in a circuit.

The holder, designated generally by the numeral 10, comprises a body having a generally rectangular four sided box-like configuration, with two stepped sides and a generally cylindrical cavity for holding an electrical or electronics component, and with means on two sides for providing termination for leads for the electrical component. The body is formed such as by molding out of a suitable material, such as polyphenylene sulfide, or a liquid crystal polymer. The body is formed with a generally cylindrical cavity 12, which in this instance is in the underside for receiving a circuit element, such as a bi-filar wound toroidal core. This illustrated circuit element has multiple windings on a toroidal core providing a special inductor. More specific details of cores of this type and their construction are disclosed in U.S. Pat. No. 4,548,365, which is incorporated herein by reference as though fully set forth.

Figure 1:
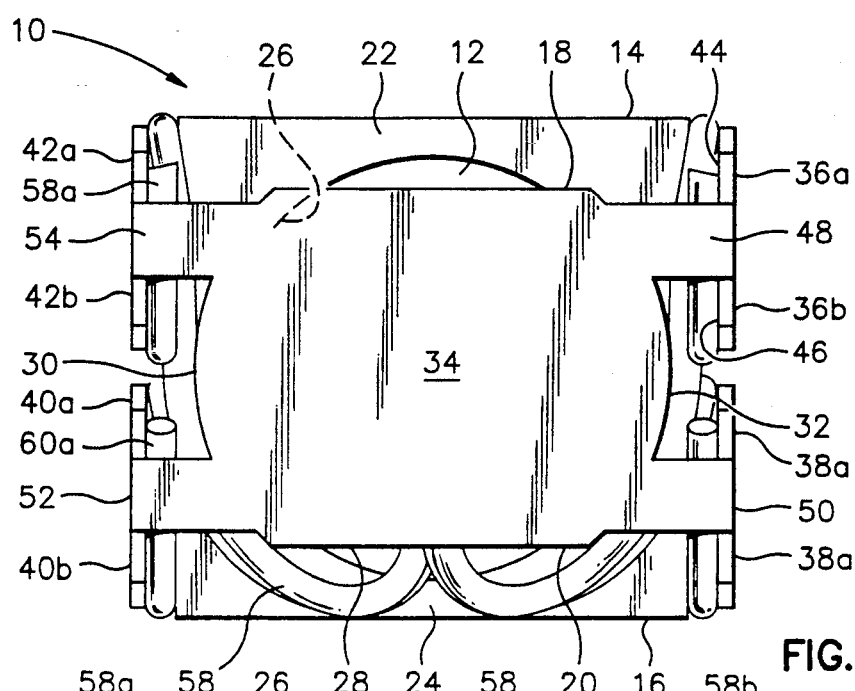
FIG. 1 is a top plan view illustrating a preferred embodiment of the invention.
Figure 2:
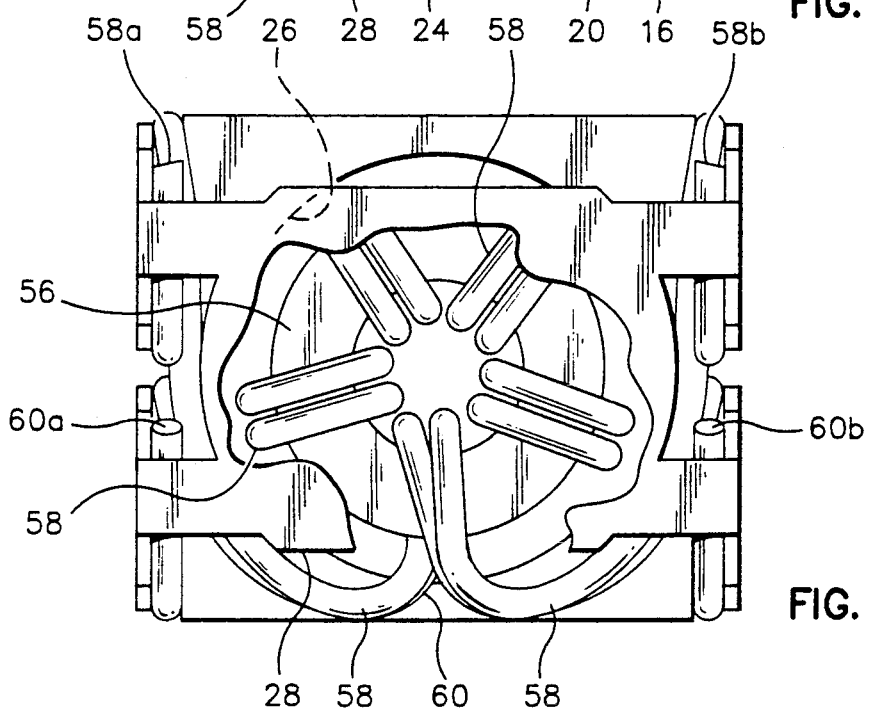
FIG. 2 is a top plan view of the embodiment of FIG. 1 with portions of the top broken away to reveal details.

The body is formed of a generally box-like rectangular configuration, with two stepped sides formed with a base portion having sides 14 and 16 of a first width, and upper or top section or portion with stepped inward sides 18 and 20 of a second narrower width. The top section or portion of the body has a width that is less than the diameter of the cylindrical cavity 12, thus providing openings in the top surfaces 22 and 24 of the base, as seen in FIGS. 1 and 2. This bore 12 also extends into and provides openings 26 and 28 in the sides 18 and 20 of the top.

The top portion of the holder has rounded sides or ends 30 and 32, which curved ends provide a form for bending of large gauge wires as will be explained. The top surface of the top of the holder 34 is smooth to enable vacuum pick and place by assembly machine.

The holder is formed at two sides or ends thereof, each with a pair of lead support or mount members 36, 38, 40 and 42 extending outward from the base of the holder body. Each lead support member, only one of which 36 will be described in detail, comprises a pair of semicircular pins 36a and 38b extending outward from the base portion and forming an area 40 of non-support therebetween. Each finger member 36a and 38b includes a groove 44 and 46 extending around the curved surface thereof, forming a spool-like configuration for mounting, shaping and forming an end of a wire to form a lead. Disposed above each of the lead support members and extending outward from the side or end of the top portion of the holder or body is a latch finger 48, 50, 52 and 54, each having a slot or groove (only two, 51 and 53 shown) for receiving the end of a lead.

The coil carrier 10 is illustrated mounting a wound toroid assembly having two coils or wires. A toroidal core 56 is wound with a pair of conductor wires 58 and 60, which in the illustrated embodiment forms four loops around the core 56. The wires 58 and 60 have what may be termed for convenience an inlet terminal end 58a and 60a and an outlet terminal end 58b and 60b, respectively. The ports or passages 26 and 28 provide easy and convenient ports for passage of the wires 58 and 60. As seen in FIG. 2, the port 28 provides ample room to accommodate the two windings. The ports or passages 26 and 28 may also serve as cooling passages for high current coils.

The coil may be wound and inserted into the cavity 12, with the leads extending out passage or port 28. The large gauge wires 58 and 60 are then bent and extended along the wire paths to the respective lead support members. Lead 58, for example, can be easily curved around the illustrated path and wound around the lead support members 42a and 42b, with the terminal end 58a latched into the notch of the latch finger 54. Similarly, the terminal end 60a of lead 60 is easily passed from the port 28 and extended around the lead support member 52a and 52b, and the terminal end 60a latched beneath the finger 52.

The opposite ends of each of the leads 58 and 60 are extended along the gradually curved path and around the respective lead support members 36a and 36b and 38a and 38b and latched in the notch beneath the respective latch fingers 48 and 50. Thus, the natural orientation of the wires from the wound toroid are accommodated. These lead wires usually end up, after winding on the core, within zero to thirty degrees of each other on opposite sides (or top and bottom) of the core.

The wire paths and forms have a maximized radii which permit the use of relative large wire gauges, such as sixteen (16) to twenty-eight (28) AWG for easy routing and securing of the coil leads on a surface mount platform.

The end portion of the wire leads from where they begin to separate at each end of the carrier are dipped in hot molten solder, which strips the insulation therefrom and coats the lead ends. Thus, the solder coated ends are wound about the lead support members, thereby forming convenient and effective surface mount terminals for the package. The routing of the leads around the sides of the assembly provides a low profile for the unit. The symmetry of the carrier provides flexibility of wire rooting and wire gauges, including mixing of wire gauges that may produce different electrical configurations, such as inductors, transformers, etc.

Figure 3:
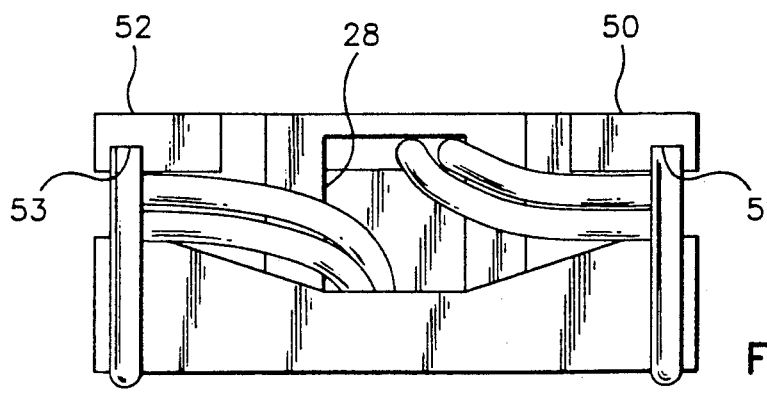
FIG. 3 is a side elevation view of the embodiment of FIG. 1.

The two side ports 26 and 28 not only allow various wire routing configurations but also aid in cooling of high current units. The slots between the semicircular wire forms and support members provide an unsupported band 40 (FIG. 4) for the naturally curved wire to be post formed as a completed assembly to insure coplanarity of the lead terminals. When first wound on the lead terminal support 36a, 36b, the lead is curved as shown in phantom in FIG. 4. After assembly, the lead is straightened, as shown, to provide coplanarity. As can be seen in FIGS. 3 and 4 the leads extend to a coplanar in a plane spaced from and below the bottom surface of base plane of the base of the holder.

Referring now to FIGS. 5-7, an alternate embodiment of the holder of the present invention is illustrated. This holder or housing has the general overall configuration as the prior embodiment, but is designed for a single wire winding. The housing has a generally rectangular four sided box-like configuration, with two stepped sides and a generally cylindrical cavity for holding an electrical or electronics component. The body, designated generally by the numeral 68, is formed with a generally cylindrical cavity 70 opening to the underside for receiving an electrical element or component. The body is formed with two stepped sides, formed with a base portion having sides 72 and 74, with the sides stepped to an upper section or portion with inwardly stepped sides 76 and 78.

As in the previous embodiment, the top section or portion of the body has a width that is less than the diameter of the cylindrical cavity 70, thus providing openings in the top surfaces 80 and 82 of the base. The bore 70 also extends upward into the top portion and provides openings, only one of which 86 is shown in FIG. 6. The top of the holder, as in the previous embodiment, has a smooth surface 88 to enable vacuum pick-up and placement by assembly machines.

The holder is formed with a pair of lead support or mount members on opposite sides or ends 90 and 92, with a groove 94 and 96 formed at each end thereof for receiving a lead end of a wire 98. The lead mounts or supports each also have an unsupported section, only one of which is shown 100 on the mount 92. The wire or winding 98 is wound about a core as in the previous embodiment, and the terminal ends thereof 98a and 98b extend across the terminal support sides 90 and 92, providing a straight terminal bonding portion thereof projecting beneath the lower surface of the holder or housing 68 for bonding directly to a PC board. The terminal ends of the wires extend upward to and are crimped around pairs of shoulders 102 and 104 on the respective side 72 of the holder. The opposite side 74 has similar shoulders 106 and 108 for holding crimped ends as described above.

The symmetrical shape of the header or carrier body provides for good injection molding flow characteristics that minimize warpage, while maximizing strength and rigidity. The configuration is also designed to be produced from an economical injection mold without slow and expensive sliders. The construction of the wire pads, guides and locking slots of the unit control the location of each of the lead, and at the same time permit lead compliance or movement to accommodate thermal expansion mismatch between carrier and printed circuit board.

In assembling the unit, the toroidal core is wound with a suitable number of wires and windings, which in the illustrated embodiment would be four windings, and mounted within the cavity 12. The terminal end of each of the windings is extended to and wrapped around selected pairs of the terminal support members, as illustrated in FIGS. 2-5. The terminal members are then dipped in a solder hot enough to melt the insulation therefrom and tin coat the terminal leads. The unit is then placed in an appropriate position on a PC board, with the lead terminals disposed over solder pads which have been pretreated with a solder paste, and are bonded in place by reflow of the solder and solder paste. This construction eliminates the need for lead frames and terminals pins. It is also simple, easy and inexpensive to construct. Thus, from the above, it will be seen that I have provided a simple and inexpensive holder with a header that can be simply and easily manufactured and quickly and easily mounted on a PC board.

While I have illustrated and described my invention by means of specific embodiments, it should be understood that numerous changes and modifications may be made therein without departing from the spirit and scope of the invention as defined in the appended claims.

I claim:

1. A self leaded holder for surface mounting of a circuit element to a PC board, comprising:
   a unitary support body having a cavity for supporting a circuit element and for mounting said circuit element on a PC board, said body having a top and a base, the base terminating in a base place;
   a lead support member integral with and extending outward from each side of said support body adjacent said base and positioned for supporting a lead in a common plane spaced below said base plane for surface engagement and bonding to a PC board;
   a lead and vent passage in a side of said body;
   a circuit element mounted in said support body; and
   a terminal end of a lead wire extending from said circuit element via said passage and wound at least partially around said lead support member and having a portion disposed at said common plane parallel to and below said base plane for engagement and surface bonding to a PC board.

2. A self leaded holder according to claim 1 wherein said lead support member extends generally horizontally outward from said body and has a generally spool-like configuration.

3. A self leaded holder according to claim 1 wherein said support member has an area of non-support of said portion for enabling straightening thereof.

4. A self leaded holder according to claim 3 wherein:
   said lead support member comprises a pair of spaced apart semi-circular pins; and
   a lead receiving groove formed on each of said pins.

5. A self leather holder according to claim 1 wherein said support body has a plurality of said lead support members extending outward from each side.

6. A self leaded holder according to claim 5 wherein said lead support members extend generally horizontally outward from opposite sides of said support body.

7. A self leaded holder according to claim 6 wherein:
   said circuit element is an inductance coil; and a lead extends from said coil via said lead and vent passage to each of said lead support members.

8. A self leaded holder according to claim 6 wherein said circuit element comprises multiple coils wound on a common toroidal core and pairs of leads of each coil are wound on pairs of said lead support members.

9. A self leaded holder according to claim 6 wherein said body includes a latch finger having a notch on an outer end thereof disposed above each of said support members; and
   said leads are each crimped across a respective one of said lead support members and extend into a notch on a latch finger.

10. A self leaded holder according to claim 6 wherein:
    said circuit element is an inductance coil; and
    a lead extends from said coil to each of said lead support members.

11. A self leaded holder according to claim 10 wherein:
    said lead support member comprises a pair of spaced apart semi-circular pins; and
    a lead receiving groove formed on each said pins.

12. A self leaded holder for surface mounting of a circuit element to a PC board, comprising:
    a generally box-like unitary support body having a cavity for receiving a circuit element and for mounting said circuit element on a PC board, said body having a top and a base, the base having a bottom surface defining a base plane;
    a lead support member integral with and extending outward from opposite sides of said support body adjacent said base for supporting a lead in a common plane parallel to said base plane;
    said body having stepped sides intersecting said cavity and forming a lead and vent passage in opposite sides of said body;
    a circuit element mounted in said support body; and
    a terminal end of a lead wire extending from said circuit element via said passage and wound at least partially around said lead support member and having an elongated portion disposed at said base in said common plane for engagement with and surface bonding to a PC board.

13. A self leaded holder according to claim 12 wherein said support member has a span of non-support of said elongated portion for enabling straightening.

14. A self leaded holder according to claim 13 wherein:
    said lead support member comprises a pair of spaced apart semi-circular pins; and said lead support members have a generally spool like configuration with a lead receiving groove formed on each of said pins.

15. A self leaded holder according to claim 14 wherein:

said circuit element is an inductance coil; and a lead extends from said coil to each of said lead support members.

16. A self leaded holder according to claim 15 wherein:

said body includes a latch finger having a notch on an outer end thereof disposed above each of said support members; and said leads are each crimped across a respective one of said lead support members and extend into a notch on a latch finger.

17. A self leaded holder according to claim 13 wherein said stepped sides step in from a wide base to a narrow top, and ports open in said sides above said base;

support members have a shoulder on an outer end thereof; and said leads are each crimped across a shoulder of a respective one of said lead support members.

18. A self leaded holder for surface mounting of a circuit element to a PC board, comprising:

a generally box-like unitary support body having stepped sides and a generally cylindrical cavity for receiving a circuit element for mounting said circuit element on a PC board, said body having a top and a base, the base terminating in a base plane;

a lead support member integral with and extending outward from opposite sides of said support body parallel to and adjacent said base plane and having a generally spool-like configuration with a lead receiving groove formed therein for supporting a lead in a common plane parallel to and adjacent said base plane for surface bonding to a PC board;

a lead and vent port formed in each of a pair of opposite stepped sides of said body by extension of said cylindrical cavity through said base and stepped sides;

an inductance coil mounted in said cavity; and a terminal end of a lead wire extending from said circuit element via said port and wound at least partially around each of said lead support members and having an elongated portion disposed at said base for engagement with and surface bonding to a PC board.

19. A self leaded holder according to claim 18 wherein:

said body is stepped on a pair of the sides from a wide base to a narrow top, and said lead and vent ports open in said sides above said base;

said lead support member comprises a pair of spaced apart semi-circular pins defining a span of non-support;

said body includes a latch finger having a notch on an outer end thereof disposed above each of said support members; and said leads are each crimped across a respective one of said lead support members and extend into a notch on a latch finger.

20. A self leaded holder according to claim 18 wherein:

said body is stepped on a pair of the sides from a wide base to a narrow top, and ports open through a top of said base and in said sides above said base;

said lead support members have a shoulder on an outer end thereof; and said leads are each crimped across a shoulder of a respective one of said lead support members.

* * * * *